(12) United States Patent
Sandhu et al.

(10) Patent No.: US 10,714,175 B2
(45) Date of Patent: Jul. 14, 2020

(54) METHOD, SYSTEM AND DEVICE FOR TESTING CORRELATED ELECTRON SWITCH (CES) DEVICES

(71) Applicant: ARM Ltd., Cambridge (GB)

(72) Inventors: Bal S. Sandhu, San Jose, CA (US); Glen Arnold Rosendale, Palo Alto, CA (US)

(73) Assignee: ARM, Ltd., Cambridge (GB)

( * ) Notice: Subject to any disclaimer, the term of this patent is extended or adjusted under 35 U.S.C. 154(b) by 0 days.

(21) Appl. No.: 15/729,419

(22) Filed: Oct. 10, 2017

(65) Prior Publication Data

US 2019/0108882 A1   Apr. 11, 2019

(51) Int. Cl.
| | | |
|---|---|---|
| G11C 13/00 | (2006.01) | |
| H01L 45/00 | (2006.01) | |
| G11C 29/50 | (2006.01) | |
| G11C 11/56 | (2006.01) | |
| H01L 27/24 | (2006.01) | |

(52) U.S. Cl.
CPC ...... *G11C 13/0069* (2013.01); *G11C 11/5685* (2013.01); *G11C 13/0002* (2013.01); *G11C 13/003* (2013.01); *G11C 13/004* (2013.01); *G11C 13/0007* (2013.01); *G11C 13/0061* (2013.01); *G11C 29/50* (2013.01); *G11C 29/50008* (2013.01); *H01L 45/04* (2013.01); *H01L 45/10* (2013.01); *H01L 45/146* (2013.01); *G11C 2013/005* (2013.01); *G11C 2013/0078* (2013.01); *G11C 2029/5002* (2013.01); *G11C 2029/5006* (2013.01); *G11C 2213/15* (2013.01); *G11C 2213/31* (2013.01); *G11C 2213/32* (2013.01); *G11C 2213/79* (2013.01); *H01L 27/2436* (2013.01); *H01L 27/2463* (2013.01); *H01L 45/1233* (2013.01); *H01L 45/1253* (2013.01); *H01L 45/147* (2013.01)

(58) Field of Classification Search
None
See application file for complete search history.

(56) References Cited

U.S. PATENT DOCUMENTS

| | | | |
|---|---|---|---|
| 5,991,214 A * | 11/1999 | Merritt | G11C 29/02 365/149 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 * | 12/2016 | Sandhu | G11C 11/56 |
| 9,548,118 B1 | 1/2017 | Bhavnagarwala et al. | |
| 9,558,819 B1 | 1/2017 | Aitken et al. | |
| 9,589,636 B1 | 3/2017 | Bhavnagarwala et al. | |
| 9,621,161 B1 | 4/2017 | Das et al. | |
| 9,627,615 B1 | 4/2017 | Reid et al. | |

(Continued)

*Primary Examiner* — Douglas King
(74) *Attorney, Agent, or Firm* — Berkley Law & Technology Group, LLP

(57) ABSTRACT

Disclosed are methods, systems and devices for operation of correlated electron switch (CES) devices. In one aspect, a CES device may be placed in any one of multiple impedance states in a write operation by controlling a current and a voltage applied to terminals of the non-volatile memory device. In one implementation, a CES device may be placed in a high impedance or insulative state, or two more distinguishable low impedance or conductive states.

22 Claims, 8 Drawing Sheets

(56) References Cited

U.S. PATENT DOCUMENTS

| | | | |
|---|---|---|---|
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 2002/0048193 A1* | 4/2002 | Tanikawa | G11C 16/30 365/185.33 |
| 2005/0286308 A1* | 12/2005 | Nagashima | G11C 16/06 365/185.22 |
| 2007/0272987 A1* | 11/2007 | Kang | H01L 45/06 257/379 |
| 2008/0086604 A1* | 4/2008 | Naso | G06F 13/16 711/154 |
| 2008/0107801 A1 | 5/2008 | Celinska et al. | |
| 2009/0003035 A1* | 1/2009 | Philipp | G11C 11/5614 365/148 |
| 2009/0141549 A1* | 6/2009 | Lee | G11C 7/1078 365/163 |
| 2013/0285699 A1* | 10/2013 | McWilliams | H03K 19/173 326/41 |
| 2017/0033782 A1 | 2/2017 | Shifren | |
| 2017/0045905 A1 | 2/2017 | Sandhu et al. | |
| 2017/0047115 A1 | 2/2017 | Aitken et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |
| 2017/0077400 A1 | 3/2017 | Shifren et al. | |
| 2017/0084331 A1 | 3/2017 | Bhavnagarwala et al. | |
| 2017/0092858 A1 | 3/2017 | Shifren | |
| 2017/0099049 A1 | 4/2017 | Sandhu et al. | |
| 2017/0103809 A1 | 4/2017 | Bhavnagarwala et al. | |
| 2017/0110191 A1 | 4/2017 | Aitken et al. | |
| 2017/0117043 A1 | 4/2017 | Sandhu et al. | |
| 2017/0147207 A1 | 5/2017 | Hansson et al. | |
| 2017/0178718 A1 | 6/2017 | Savanth et al. | |
| 2017/0178724 A1 | 6/2017 | Bhavnagarwala et al. | |
| 2017/0179385 A1 | 6/2017 | Shifren et al. | |
| 2017/0206963 A1 | 7/2017 | Bhavnagarwala et al. | |
| 2017/0207784 A1 | 7/2017 | Das et al. | |
| 2017/0213592 A1 | 7/2017 | Bhavnagarwala et al. | |
| 2017/0213960 A1 | 7/2017 | Paz De Araujo et al. | |
| 2017/0213961 A1 | 7/2017 | Paz De Araujo et al. | |
| 2017/0237001 A1 | 8/2017 | Reid et al. | |
| 2017/0243621 A1 | 8/2017 | Aitken et al. | |
| 2017/0243622 A1 | 8/2017 | Sandhu et al. | |
| 2017/0243646 A1 | 8/2017 | Shifren et al. | |
| 2017/0244027 A1 | 8/2017 | Reid et al. | |
| 2017/0244032 A1 | 8/2017 | Reid et al. | |
| 2017/0250340 A1 | 8/2017 | Paz De Araujo et al. | |

\* cited by examiner

METHOD, SYSTEM AND DEVICE FOR TESTING CORRELATED ELECTRON SWITCH (CES) DEVICES

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

SUMMARY

Briefly, particular implementations are directed to an integrated circuit device comprising: one or more correlated electron switch (CES) elements; one or more first terminals to receive one or more first signals to control operations to transition the at least one of the one or more CES elements between a low impedance or conductive state and a high impedance or insulative state; and one or more second terminals to receive one or more second signals to limit a magnitude of a current in the at least one of the one or more CES elements in operations to place the at least one of the one or more CES elements in the low impedance or conductive state.

Another particular implementation is directed to a method comprising: applying one or more first signals to one or more first terminals of an integrated circuit device to control operations to transition at least one of one or more CES elements of the integrated circuit device between a low impedance or conductive state and a high impedance or insulative state; and applying one or more second signals to one or more second terminals of the integrated circuit device to limit a magnitude of a current in the at least one of the one or more CES elements in operations to place the at least one of the one or more CES elements in the low impedance or conductive state.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
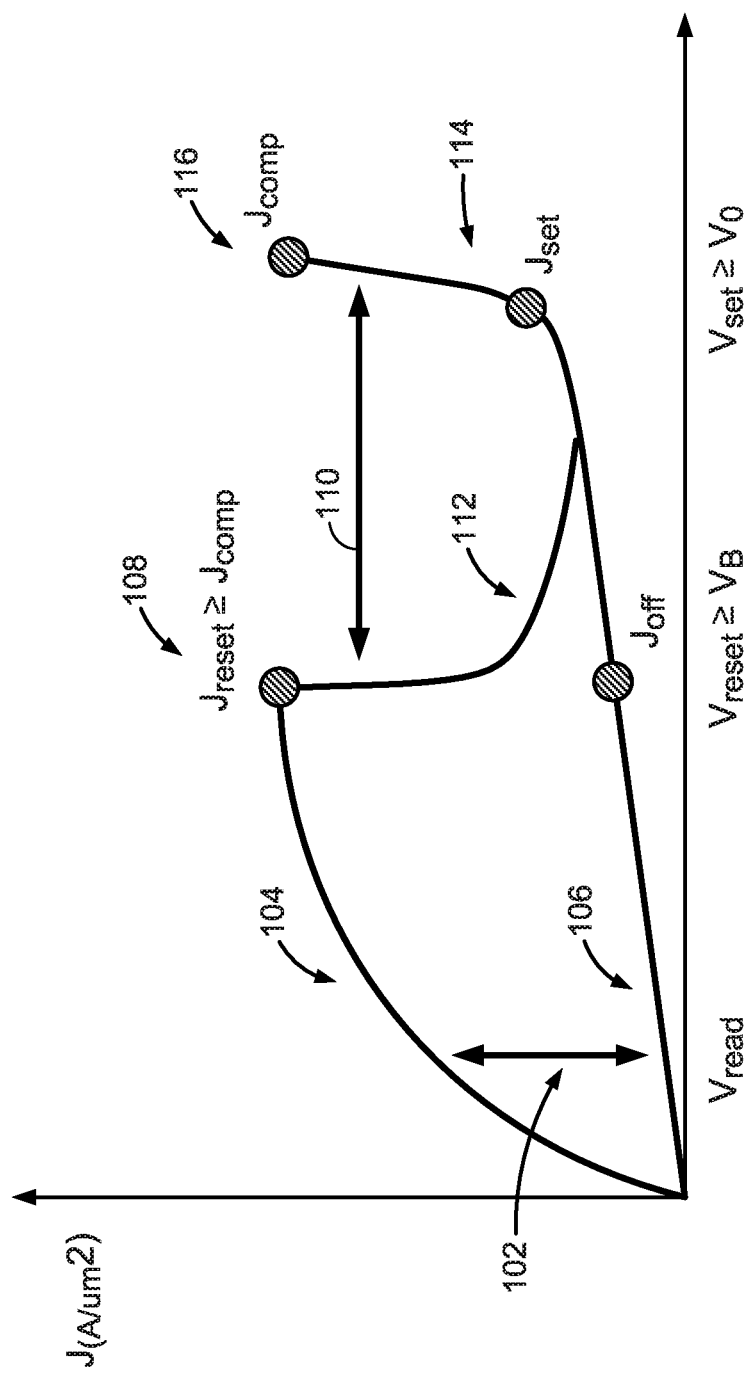
FIG. 1A shows a plot of current density versus voltage for a correlated electron switch (CES) element according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to conductive state if a Mott transition condition occurs. The criteria may be defined by the condition $(n_C)^{1/3} a=0.26)$, where $n_C$ is a concentration of electrons and "a" is a Bohr radius. If a critical carrier concentration is achieved such that the Mott criteria is met, a Mott transition may occur and state may change between a high resistance/capacitance and a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES element; a write circuit for placing the resistive switching memory cell in a first resistive state or a second resistive state depending on signals provided to the memory cell, wherein a resistance of the CES element is higher in the second resistance state than in the first resistance state; and a read circuit for sensing the state of the memory cell and providing an electrical signal corresponding to the sensed state of the memory cell. In a particular implementation, a CES element may switch resistive states responsive to a Mott-transition in the majority of the volume of the CES element. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES element may be placed in any one of two or more different and distinguishable low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES element of FIG. 1A may include any TMO, such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES element. In an embodiment, a CES element may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1 R,2R-cyclohexanediamine, and other such metal complexes may be used without deviating from claimed subject matter.

In one aspect, the CES element of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO($C_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO($L_x$), where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES element may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES element is still in the insulative state, current may generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 1A, a current density $J_{comp}$ applied during a write operation at point 116 to place the CES element in a conductive or low impedance state may determine a compliance condition for placing the CES element in a high impedance or insulative state in a subsequent write operation. As shown, the CES device may be subsequently placed in an insulative or high impedance state by application of a current density $J_{reset} \geq J_{comp}$ at a voltage $V_{reset}$ at point 108, where $J_{comp}$ is externally applied.

The compliance therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

where:
  $\lambda_{TF}$ is a Thomas Fermi screening length; and
  C is a constant.

According to an embodiment, a current or current density in a region 104 of the plot shown in FIG. 1A may exist in response to injection of holes from a voltage signal applied across terminals of a CES element. Here, injection of holes may meet a Mott transition criterion for the conductive state to insulative state transition at current $I_{MI}$ as a critical voltage $V_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
  $A_{CeRam}$ is a cross-sectional area of a CES element; and
  $J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES element to a conductive memory state, as enough electrons have been injected and the potential across terminal of the CES element overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES element to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \qquad (4)$$
$$Q(V_{MI}) = qn(V_{MI})$$
$$I_{MI}(V_{MI}) = \frac{Q(V_{MI})}{t} = \frac{qn(V_{MI})}{t} = \frac{q}{t}\left(\frac{C}{a_B}\right)^3$$
$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:
  $a_B$ is a Bohr radius.

According to an embodiment, a "read window" 102 for detecting a memory state of a CES element in a read operation may be set out as a difference between a portion 106 the plot of FIG. 1A while the CES element is in an insulative state and a portion 104 of the plot FIG. 1A while the CES element is in a conductive state at a read voltage $V_{read}$. In a particular implementation, read window 102 may be used to determine a Thomas Fermi screening length $\lambda_{TF}$ of material making up the CES element. For example, at a voltage $V_{reset}$, current densities $J_{reset}$ and $J_{set}$ may be related to according to expression (5) as follows:

$$\lambda_{TF}(@\ V_{reset}) = a_B\left(\frac{J_{reset}}{J_{off}}\right)^{\frac{1}{3}} \qquad (5)$$

In another embodiment, a "write window" 110 for placing a CES element in an insulative or conductive memory state in a write operation may be set out as a difference between $V_{reset}$ (at $J_{reset}$) and $V_{set}$ (at $J_{set}$). Establishing $|V_{set}| > |V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined based, at least in part, by materials and doping of the CES element.

Figure 1B:
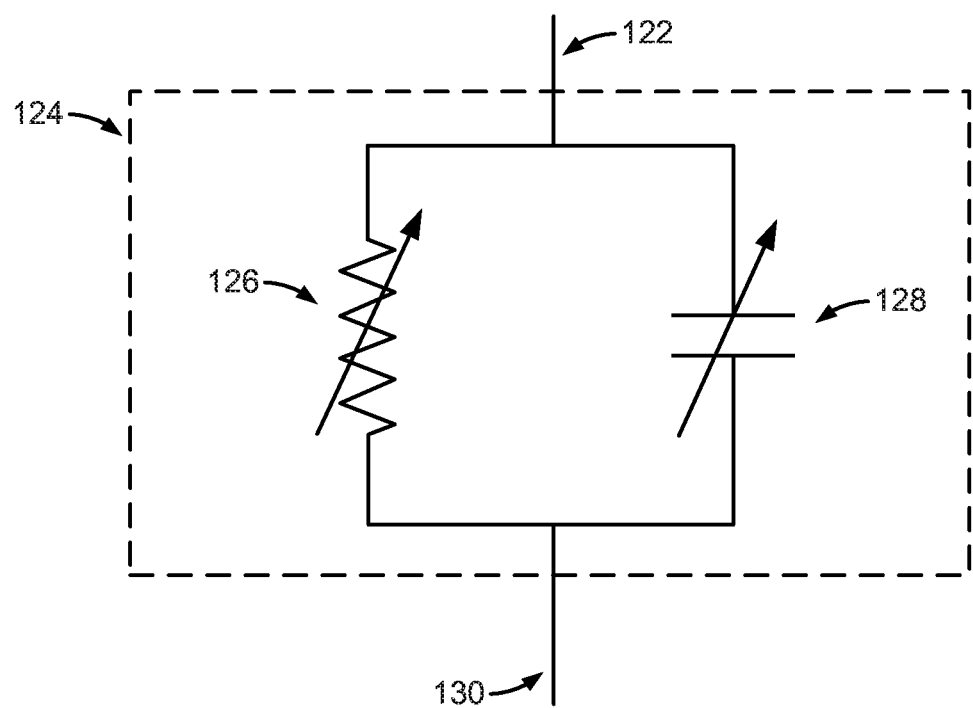
FIG. 1B is a schematic diagram of an equivalent circuit to a CES element according to an embodiment.

The transition from high resistance/capacitance to low resistance/capacitance in a CES element may be represented by a singular impedance of the CES element. FIG. 1B depicts a schematic diagram of an equivalent circuit of an example variable impeder device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In the particular implementation of a CES element of FIG. 1A, the CES element may be placed in either of two different impedance states: a low impedance or conductive state responsive to a set operation and a high impedance or insulative state responsive to a reset operation. According to an embodiment, a CES element may be placed in a low impedance or conductive state, in addition to a high impedance or insulative state. As such, the CES element may be programmable in a write operation to be in any one of three or more distinguishable impedance states. This may expand a usefulness of a CES element beyond merely representing a binary state.

Different processes for the fabrication of CES elements in a circuit (e.g., in combination with processes to fabricate other devices such as FETs using CMOS processing) may be defined by different fabrication parameters. Different processes for fabricating devices (e.g., according to particular defined "processing nodes") may be defined or specified, at least in part, by various parameters or variables yielding varying results. For example, different processes for fabricating devices may yield different performance and endurance characteristics. One performance characteristic of a CES element may comprise a difference in impedance of the CES element while in a low impedance or conductive state (e.g., following a SET operation) and while in a high impedance or insulative state (e.g., following a RESET operation). Such a difference in impedance of the CES element while in a low impedance or conductive state and while in a high impedance or insulative state may be referred to as a "read margin." In one example, an endurance characteristic may relate to a quantity of write operations that may be applied to a CES element before performance of the CES element degrades to an unacceptable level. For example, an endurance characteristic may relate to a quantity of write operations that may be applied to a CES element before a write margin degrades below an acceptable level.

Particular embodiments described herein are directed to, among other things, circuitry for applying repetitive write operations to CES elements formed according to a particular process and evaluate endurance characteristics of the CES elements following application of the repetitive write operations. This may allow for convenient evaluation of different candidate processes that may be used for fabrication of devices that incorporate CES elements.

Figure 2A:
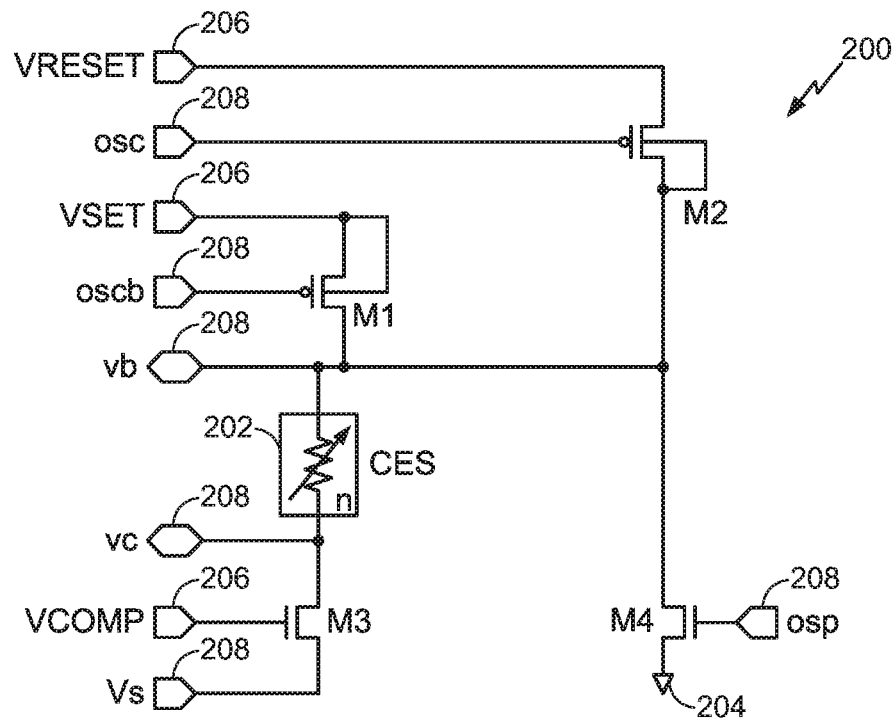
FIG. 2A is a schematic diagram of a circuit for applying operations to a CES element according to an embodiment.
Figure 3:
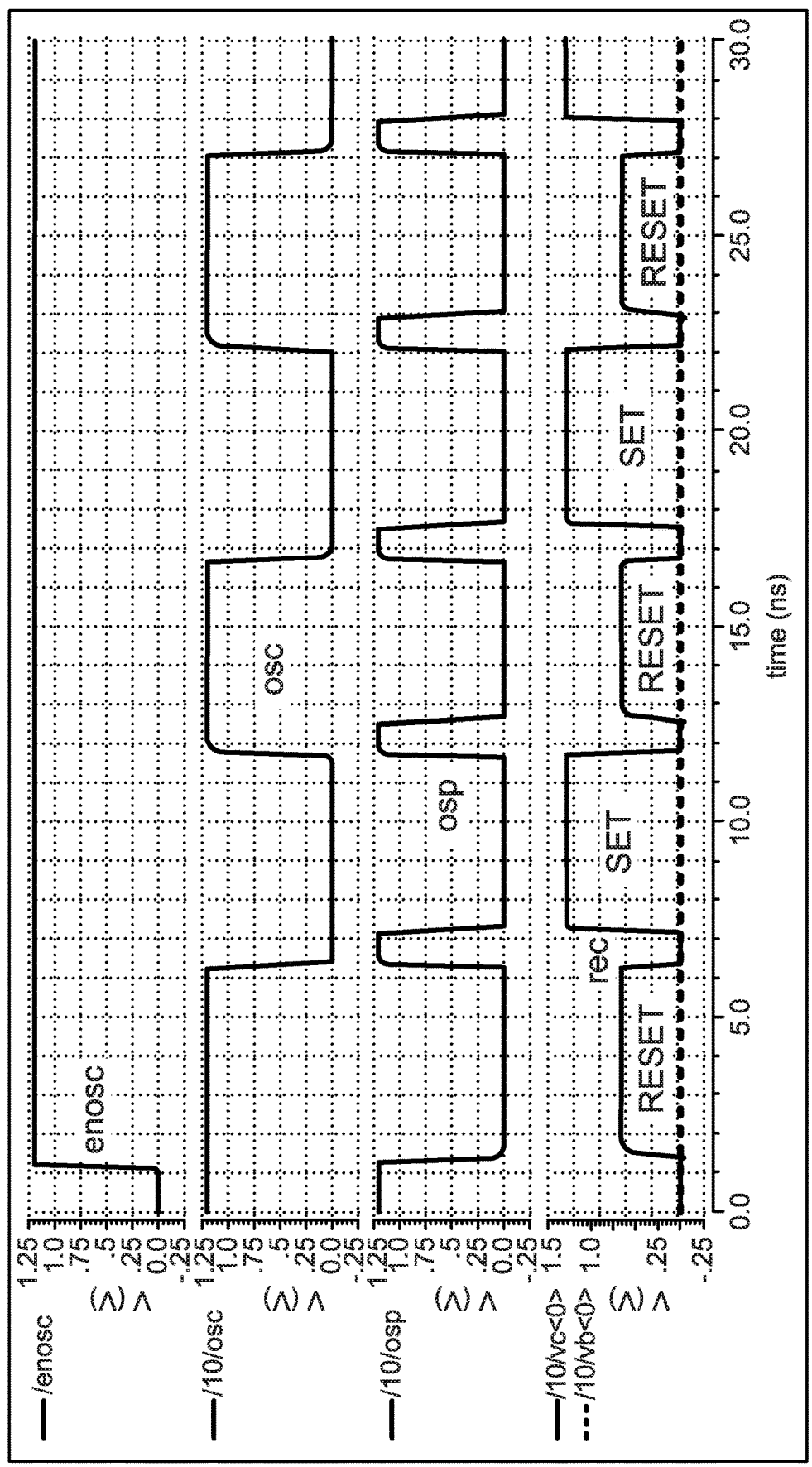
FIG. 3 is a timing diagram of signals to be applied to a device in applying operations to a CES element according to an embodiment.

FIG. 2A is a schematic diagram of a circuit 200 for applying repetitive write operations to a CES element 202 according to an embodiment. In a particular implementation, circuit 200 may be formed as part of an integrated circuit device where one or more of terminals 206 comprise external signal pins. Terminals 208 may be coupled to devices on-chip, for example. CES element 202 may be formed as part of a bitcell among multiple bitcells of a memory array using one or more processes for forming CES elements from CEM as described above. Other portions of circuit 200 may be formed using one or more processes to form complementary metal oxide semiconductor (CMOS) devices. Multiple alternating SET and RESET operations may be applied to CES element 202 under the control of oscillator signals osc and oscb. Signal osc may be generated according to a timing diagram as shown in FIG. 3 while the signal enosc is taken high. Signal oscb may be a complement of signal osc (e.g., signal oscb is generated high while signal osc is low and signal oscb is generated low while signal osc is high). During repetitive write operations, FET M3 may be at least partially closed in response to a voltage signal VCOMP applied to a gate terminal of FET M3 to at least partially connect a first terminal of CES 202 to common source voltage Vs while voltage VRESET or VSET is coupled to a second terminal of CES 202. If a voltage of signal osc applied to a gate terminal of FET M2 is high and a voltage of signal oscb applied to a gate terminal of FET M1 is low, FET M2 may be opened to disconnect voltage VRESET and FET M1 may be closed to couple voltage VSET for a write operation to place CES element 202 in a low impedance or conductive state. Conversely, if the voltage of signal osc applied to a gate terminal of FET M2 is low and the voltage of signal oscb applied to a gate terminal of FET M1 is high, FET M1 may be opened to disconnect voltage VSET and FET M2 may be closed to couple voltage VRESET for a write operation to place CES element 202 in a high impedance or conductive state.

As may be observed from the timing diagram of FIG. 3, SET and RESET operations may be applied to CES element 202 in an alternating fashion. According to an embodiment, a one-shot voltage pulse signal osp, may be raised between alternating SET and RESET cycles to close FET M4, short circuiting terminals of CES element 202. Node 204 may be maintained substantially at voltage Vs such that a voltage across CES element 202 may be shored while signal osp is high. Here, this allows for a one-shot recovery of CES element 202 between SET and RESET operations. In this context, a "recovery" of a CES element may be facilitated by a period of time with 0.0V of bias between terminals of the CES element to allow an equilibrium state to be established and stabilized within the CES element. Such a period of time for recovery may comprise several nanoseconds and may be varied for particular applications or for tradeoffs of speed versus reliability of recovery for the CES element.

As pointed out above, FET M3 may at least be partially closed to couple a terminal of CES 202 to source voltage Vs during SET and RESET operations. In a particular implementation, the voltage of signal VCOMP may be varied to regulate current in CES 202 during SET operations so as to limit a compliance current for subsequent RESET operation. For example, the voltage VCOMP may switch to 0.6V during a SET operation and VDD during a RESET operation. As pointed out above in connection with FIG. 1A, a current density $J_{comp}$ applied in a SET operation of a CES element at point 116 may determine a threshold magnitude of a current density $J_{reset}$ to be applied in a subsequent RESET operation at point 108 to place the CES element in a high impedance or insulative state. A voltage of signal VCOMP may be controlled at least during alternating SET operations of CES 202 (e.g., as FET M1 is closed and FET M2 is opened) to limit a current in CES 202 during the SET operations. As such, in RESET operations (e.g., as FET M1 is opened and FET M2 is closed) following the alternating SET operations, current of a sufficient magnitude may enable a RESET operation.

Figure 2B:
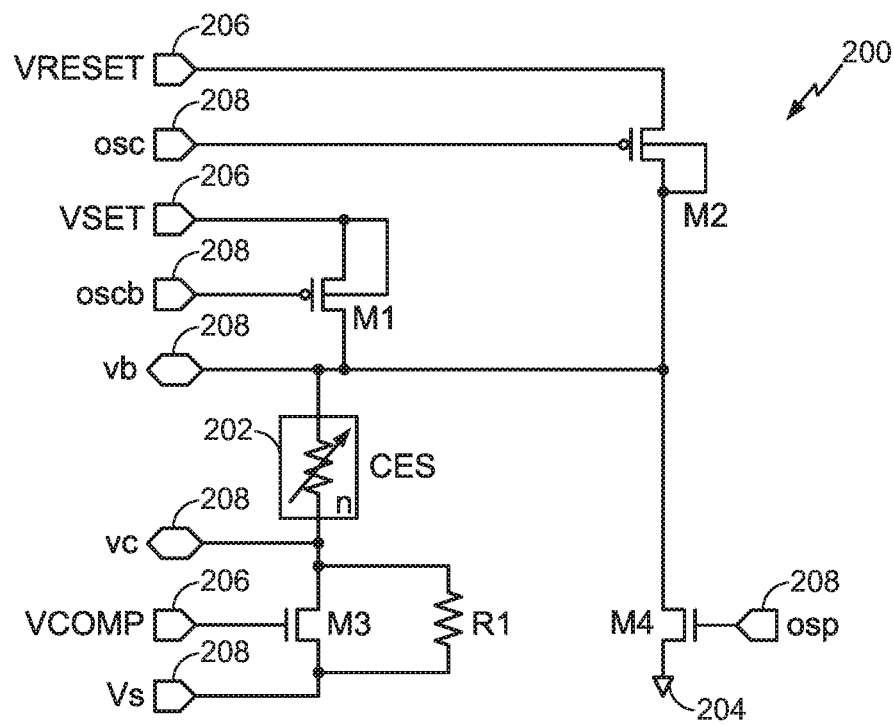
FIG. 2B is a schematic diagram of a circuit for applying operations to a CES element according to an alternative embodiment.

FIG. 2B is a schematic diagram of an alternative configuration in which a signal path between Vs and a terminal of CES element 202 is provided in parallel with FET M3. In this particular implementation, signal VCOMP may be driven high (e.g., to VDD) during a RESET operation and driven low (e.g., 0.0V) during a SET operation. A value of resistance for R1 may be chosen based on a desired current applied in CES 202 during SET operations so as to limit a compliance current for reliable application of a subsequent RESET operation. Here, instead of controlling a current level through a single path through FET M3 for both SET and RESET operations based on a gate voltage applied to FET M3, FET M3 may be completely closed during RESET operations to enable sufficient current in CES 202 to transmission to a high impedance or insulative state. In SET operations, a gate voltage may applied to FET M3 to completely open FET M3 such that a single signal path is provided between Vs and a terminal of CES element 202 through resistor R1 to limit current in CES element 202 as discussed above.

Figure 4:
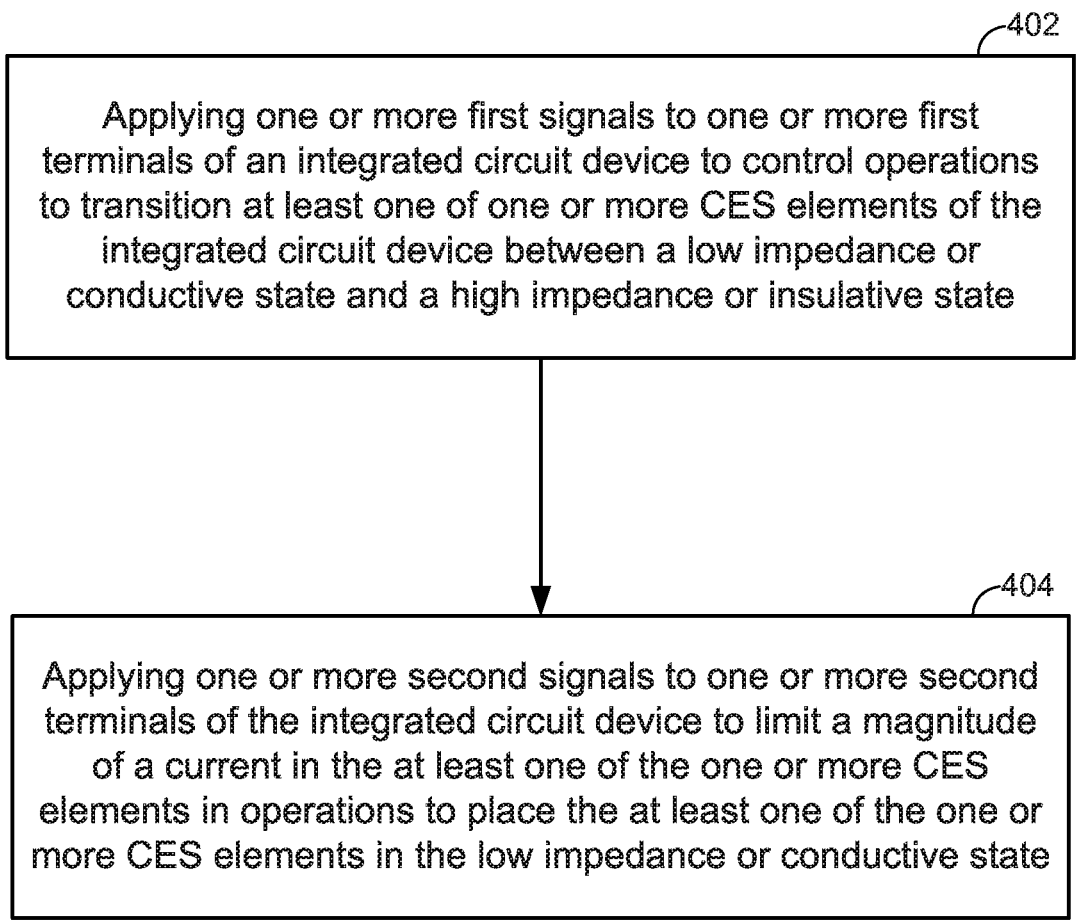
FIG. 4 is a flow diagram of a process to apply signals to a device for applying operations to a CES element according to an embodiment.

FIG. 4 is a flow diagram illustrating a process to apply signals to a CES element such as CES element 202 to apply alternating SET and RESET. As pointed out above, application of alternating SET and RESET operations to CES element may enable measuring endurance characteristics of CES element 202. At block 402, first signals may be applied to terminals of an integrated circuit device to transition the CES element between a low impedance or conductive state and a high impedance or insulative state. As pointed out above, this may comprise applying signals osc, oscb and osp as discussed above. Block 404 may comprise applying one or more second signals to one or more second terminals of the integrated circuit device to limit a magnitude of a current in the CEM element in operations to place the CEM element in the low impedance or conductive state. As pointed out above, this may comprise applying signal VCOMP to regulate current in FET M3 and CES element 202.

Figure 5:
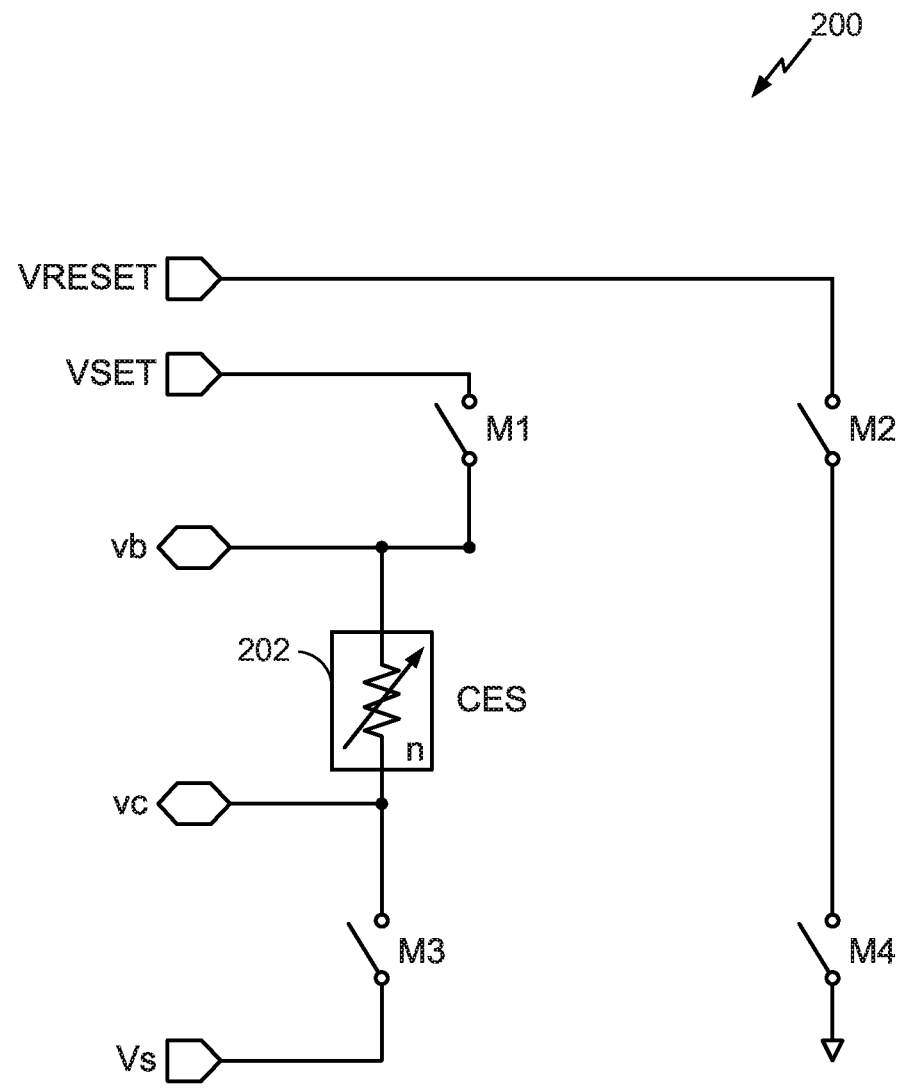
FIG. 5 is a schematic diagram of a circuit for measuring characteristics of a CES element according to an embodiment.

In addition to applying alternating SET and RESET operations to CES element 202 as discussed above, circuit 200 may enable determining measurements for computing a read margin following a predetermined number of write operations. Here, FETs M1, M2, M3 and M4 may be placed in an open state as shown in FIG. 5 by raising voltages for signals osc and oscb, and lowering voltages for signals VCOMP and osp. Measuring a current through CES element 202 responsive to application of a read voltage across terminals vb and vc, an impedance of CES 202 element may be calculated using Ohm's Law (R=V/I). In a particular implementation, this may be performed in two phases. In a first phase, after 1000 write cycles (just as an example), oscillation of signals osc and oscb may be suspended while FETs M1, M2, M3 and M4 are opened. A first impedance may then be measured between terminals vb and vc. In a second phase, signals osc and oscb may oscillate for one more cycle to apply an alternate voltage across the CES element 202 to change an impedance state of CES element 202 and then oscillation of signals osc and oscb may be suspended once again. A second impedance may then be measured between terminals vb and vc. It may be observed that if CES element 202 is in a low impedance or conductive state following the first phase, the second phase may comprise a RESET operation to place CES element 202 in a high impedance or conductive state. Likewise, it may be observed that if CES element 202 is in a high impedance or insulative state following the first phase, the second phase may comprise a SET operation to place CES element 202 in a low impedance or conductive state. Accordingly, a read margin may then be determined as a difference between the first and second impedances.

Features of circuit 200 described above may be incorporated into a larger scale system for testing endurance features of CES elements according to particular embodiments. For example, circuit 200 may be used to apply a predetermined number of SET and RESET operations on CES element 202, followed by one or more operations to measure an impedance of CES element 202 (e.g., while CES element 202 is in a high impedance or insulative state and while CES element 202 is in a low impedance or conductive state).

In a particular implementation, all or a portion of circuit 200 may be formed as a bit cell and replicated in a CeRAM bank 604 comprising, for example sixteen bitcells wide. In other implementations a CeRAM bank may have bitcells greater or fewer than sixteen. Signals VSET, VRESET and VCOMP may be applied to multiple different CES elements formed in CeRAM bank 604 as described above. Ring oscillator circuit (ROSC) 602 may generate signals osc and oscb described above to be applied to multiple different CES elements formed in CeRAM 604. According to an embodiment, ROSC may control a periodicity of signals osc and oscb according to a multi-bit code or signal mapped to different frequencies of periodicity. In the presently illustrated implementation, a periodicity of signals osc and oscb may be determined based on a 3-bit code in signal OSA<3:1> determining the periodicity to be values mapped to different values of OSA<3:1> from 50 MHz to 340 MHz. In a particular implementation, on cycles of osc and ocsb, write operations (e.g., SET or RESET operations) may be applied to multiple or all bit cells in CeRAM bank 604.

The One-shot pulse generator circuit (1SPG) 606 may generate signal osp based, at least in part, on signal osc and a pulse width. In a particular implementation, a duration for a pulse width (e.g., for application of a zero voltage across terminals of a CES element such as CES element 202 between transitions of the CES element between a low impedance or conductive state and a high impedance or insulative state) may be specified controlled by a digital signal pw<1,0> mapped to different alternative durations from 600 ps to 2.0 ns. Frequency divider (Divby64) circuit 608 may divide a frequency of signal osc to simplify monitoring a frequency of write operations applied to CES elements on a tester. Here, pulses of signal osc may be counted on a tester enabling suspending a testing program at any time to measure a read margin of CES elements (e.g., once every 1000 cycles).

Figure 6:
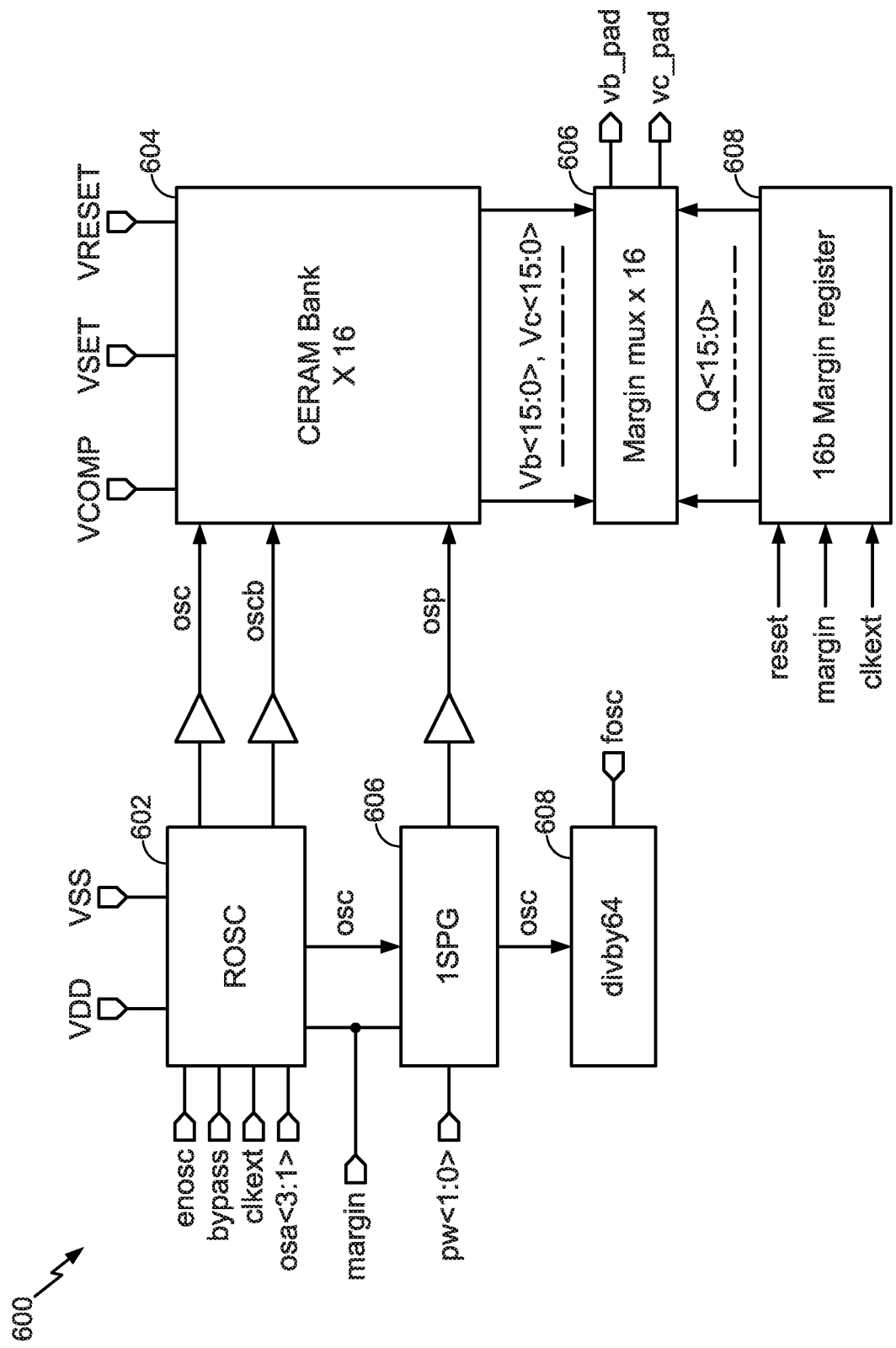
FIGS. 6 and 7 are schematic diagrams of circuitry for testing characteristics of one or more CES elements according to a particular implementation.
Figure 7:
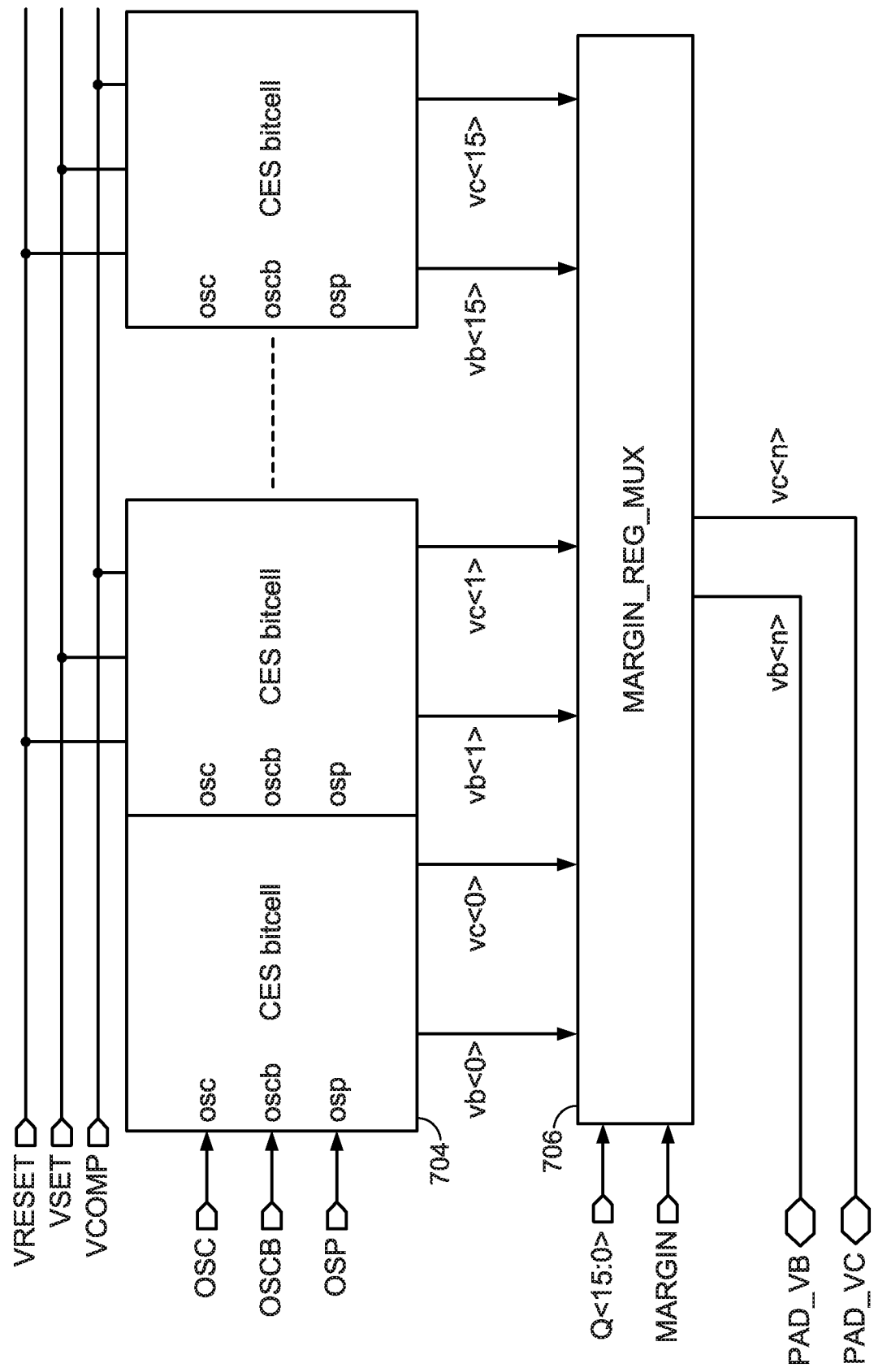

According to an embodiment, margin mux circuit 606 may individually select bitcells in CeRAM bank 604 to perform read operations as illustrated above in connection with FIG. 5. Here, a read voltage applied to conductive pads vb_pad and vc_pad may be applied across terminals of a CES element of a selected bitcell for measuring an impedance to assess a read margin as discussed above. Each bitcell may be selected one at a time through the margin mux 606. To facilitate read operations according to an embodiment, terminals vb_pad and vc_pad may be precharged to apply a read voltage across terminals of a selected CES element. An impedance across the selected CES element may then be measured on a tester based on a measurement of current from vb_pad and vc_pad as previously described. FIG. 6 is a schematic diagram of features of circuit 600 according to a particular implementation comprising bitcells (e.g., bitcells 704 shown in FIG. 7) formed in CeRAM bank 604, and features of margin register 608 and margin mux circuit 606 (e.g., combined as MARGIN_REG_MUX circuit 706 shown in FIG. 7). Here, following repeated and alternating write operations applied to CES elements of bitcells (e.g., as discussed above in connection with FIGS. 2 and 3), signal Q<15:0> may individually select a bitcell 704 for application of a read voltage (from pads PAD_VB and PAD_VC) to CES element for measuring impedance to assess read margin.

A bitcell circuit 200 may comprise one or more memory elements (e.g., non-volatile memory elements) comprising a CES device. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

According to an embodiment, CES element 202 may comprise a memory element having a behavior similar to that of the CES element discussed above in connection with FIG. 1A. For example, a memory element in bitcell 200 may be placed in a particular memory state (e.g., two or more distinguishable conductive or low impedance memory states, or insulative or high impedance memory state) by independently controlling voltage and current applied across terminals of the memory element in a "write operation." As discussed above in particular implementations, such a write operation may be executed by application of a signal which is controlled to provide a critical current and voltage across terminals of the memory device to place the memory device in a particular memory state. In another aspect, a memory state of a memory element in bitcell 200 may be detected or sensed in a "read operation."

As described in particular implementations above, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. An integrated circuit device comprising:
   one or more correlated electron switch (CES) elements;
   one or more first terminals configured to receive one or more first signals to control operations to transition the at least one of the one or more CES elements between a low impedance and/or conductive state and a high impedance and/or insulative state;
   one or more second terminals to comprise signal pins external to the integrated circuit device, the one or more second terminals to be configured to receive an externally applied signal, the externally applied signal to be at a first voltage level during a first operation to place the at least one of the one or more CES elements in the low impedance and/or conductive state, the externally applied signal to be at a second voltage level during a second operation to place the least one of the one or more CES elements in the high impedance and/or insulative state; and
   a circuit configured to limit a magnitude of a current in the at least one of the one or more CES elements during the first operation to place the at least one of the one or more CES elements in the low impedance and/or conductive state responsive to the externally applied signal at the first voltage level received at the one or more second terminals.

2. The integrated circuit device of claim 1, wherein at least one of the one or more first signals to represent a value specifying a duration of application of programming signals to terminals of the at least one of the one or more CES elements during the operations to transition the at least one of the one or more CES elements between the low impedance and/or conductive state and the high impedance and/or insulative state.

3. The integrated circuit of claim 1, wherein the integrated circuit is further configured to selectively determine a duration of application of a zero voltage across terminals of the at least one of the one or more CES elements for a transitions of the at least one of the one or more CES elements between the low impedance and/or conductive state and the high impedance and/or insulative state based, at least in part, on at least one of the one or more first signals.

4. The integrated circuit of claim 3, wherein the integrated circuit is further configured to determine the duration based, at least in part, on a digital signal mapped to alternative durations.

5. The integrated circuit device of claim 1, the circuit configured to limit current in the at least one of the one or more CES elements to comprise multiple signal paths to a terminal of the at least one of the CES elements, wherein the integrated circuit is further configured to open at least one of the multiple signal paths during operations to place the at least one of the CES elements in the low impedance or conductive state.

6. The integrated circuit device of claim 1, wherein the circuit configured to limit the magnitude of the current in the at least one of the one or more CES elements to comprise a conductive element to limit the magnitude of the current in the at least one of the one or more CES elements in operations to place the at least one of the one or more CES elements in the low impedance and/or conductive state responsive at least in part to a voltage applied to a terminal of the conductive element.

7. The integrated circuit device of claim 6, wherein the conducive element to comprise a field effect transistor, and wherein the current in the at least one of the one or more CES elements to be adjustable responsive to adjustment of a voltage applied to a gate terminal of the field effect transistor.

8. The integrated circuit device of claim 1, wherein the operations to transition the at least one of the one or more CES elements between the low impedance and/or conductive state and the high impedance and/or insulative state to occur on alternating cycles.

9. The integrated circuit device of claim 8, wherein the one or more first signals to control a periodicity of the alternating cycles.

10. The integrated circuit device of claim 9, and further comprising a circuit configured to vary the periodicity of the alternating cycles based, at least in part, on the one or more first signals.

11. The integrated circuit device of claim 10, wherein the circuit configured to vary the periodicity of the alternating cycles is further configured to vary the periodicity of the alternating cycles according to a multi-bit code mapped to alternative periodicities of the alternating cycles.

12. A method comprising:
applying one or more first signals to one or more first terminals of an integrated circuit device to control operations to transition at least one of one or more CES elements of the integrated circuit device between a low impedance and/or conductive state and a high impedance and/or insulative state;
externally applying one or more second signals to one or more second terminals of the integrated circuit device during the operations to transition the at least one of one or more CES elements of the integrated circuit device between the low impedance and/or conductive state and the high impedance and/or insulative state, at least one of the one or more second signals to be at a first voltage level to place the at least one of the one or more CES elements in the low impedance and/or conductive state and to be at a second voltage level to place the at least one of the one or more CES elements in the high impedance and/or insulative state; and
limiting a magnitude of a current in the at least one of the one or more CES elements in operations to place the at least one of the one or more CES elements in the low impedance and/or conductive state responsive to application of the at least one of the second signals to the one or more second terminals being at the first voltage level, the one or more second terminals comprising one or more signal pins external to the integrated circuit device.

13. The method of claim 12, and further comprising measuring a difference between an impedance of the at least one of one or more CES elements in the high impedance and/or insulative state and the low impedance and/or conductive state based, at least in part, on signals on one or more third terminals of the integrated circuit device.

14. The method of claim 12, and further comprising determining a duration of application of programming signals to terminals of the at least one of the one or more CES elements during the operations to transition the at least one of the one or more CES elements between the low impedance and/or conductive state and the high impedance and/or insulative state based, at least in part, on a signal representing a value specifying the duration.

15. The method of claim 12, and further comprising selectively determining a duration of application of a zero voltage across terminals of the at least one of the one or more CES elements for transitions of the at least one of the one or more CES elements between the low impedance and/or conductive state and the high impedance and/or insulative state based, at least in part, on at least one of the one or more first signals.

16. The method of claim 15, and further comprising controlling the duration based, at least in part, on a digital signal mapped to alternative durations.

17. The method of claim 12, wherein limiting the magnitude of the current in the at least one of the one or more CES elements in operations to place the at least one of the one or more CES elements in the low impedance and/or conductive state comprises opening at least one signal path of multiple signal paths to a terminal of the at least one of the one or more CES elements.

18. The method of claim 12, wherein limiting the magnitude of the current in the at least one of the one or more CES elements in operations to place the at least one of the one or more CES elements in the low impedance and/or conductive state to comprise adjusting a voltage applied to a gate terminal of a field effect transistor coupled between a terminal of the at least one of the one or more CES elements and a node.

19. The method of claim 12, wherein the operations to transition the at least one of the one or more CES elements between the low impedance and/or conductive state and the high impedance and/or insulative state to occur on alternating cycles.

20. The method of claim 19, the method further comprising controlling a periodicity of the alternating cycles based, at least in part, on the one or more first signals.

21. The method of claim 20, and further comprising varying the periodicity of the alternating cycles based, at least in part, on the one or more first signals.

22. The method of claim 21, and further comprising varying the periodicity of the alternating cycles according to a multi-bit code mapped to alternative periodicities of the alternating cycles.

* * * * *